United States Patent [19]
Iwata et al.

[11] Patent Number: 6,157,672
[45] Date of Patent: *Dec. 5, 2000

[54] PULSE MODULATION OPERATION CIRCUIT

[75] Inventors: Atsushi Iwata, Higashihiroshima; Makoto Nagata, Hiroshima, both of Japan

[73] Assignee: President of Hiroshima University, Higashihiroshima, Japan

[*] Notice: This patent is subject to a terminal disclaimer.

[21] Appl. No.: 09/018,837

[22] Filed: Feb. 4, 1998

[30] Foreign Application Priority Data

Feb. 5, 1997 [JP] Japan .................................. 9-022804

[51] Int. Cl.[7] .............................. H03K 7/08; H03K 9/08; G06G 7/12
[52] U.S. Cl. .......................... 375/238; 375/377; 327/355
[58] Field of Search .................................. 375/238, 377, 375/237, 239, 242, 353; 329/311, 312; 332/106, 109; 327/355, 182, 101

[56] References Cited

U.S. PATENT DOCUMENTS

| | | | |
|---|---|---|---|
| 4,408,166 | 10/1983 | Moeller | 329/312 |
| 4,521,736 | 6/1985 | Ryan | 329/312 |
| 5,469,101 | 11/1995 | Yepp | 327/361 |
| 5,889,424 | 3/1999 | Iwata et al. | 327/355 |
| 5,901,176 | 5/1999 | Lewison | 375/238 |

FOREIGN PATENT DOCUMENTS 0 310 170  4/1989  European Pat. Off. .
40 13 087  10/1991  Germany .

OTHER PUBLICATIONS

A. Stevens, et al., IEEE Transactions on Nuclear Science, vol. 36, No. 1, pp. 517–521, "A Fast Low–Power Time–to–Voltage Converter for High Luminosity Collider Detectors", Feb. 1989.

Primary Examiner—Stephen Chin
Assistant Examiner—Betsy L. Deppe
Attorney, Agent, or Firm—Oblon, Spivak, McClelland, Maier & Neustadt, P.C.

[57] ABSTRACT

A pulse modulation operation circuit includes a current bus, a plurality of switch current sources connected parallel to each other and commonly connected to the current bus for generating current pulses corresponding to external input signals, charge conversion element connected to the current bus for integrating the current pulses and converting them into a charge, and an output for converting the charge into a binary digital signal and outputting the binary digital signal. Each pulse width modulation signal is input to a corresponding one of the switch current sources, which in turn generates a constant current for a period corresponding to the width of each pulse of the signal, to convert each signal pulse into a current pulse. The thus-obtained current pulses are added on the common current bus, thereby obtaining, by capacitive integration, a total charge $Q_{total}$ proportional to the sum of the widths of the current pulses. To this end, a reference charge counter circuit has a function for integration and a function for digitizing the total charge $Q_{total}$ in units of a reference charge $Q_{std}$ in real time.

12 Claims, 4 Drawing Sheets

PULSE MODULATION OPERATION CIRCUIT

BACKGROUND OF THE INVENTION

This invention relates to the microelectronics field in which very large-scale parallel operations are performed in a time-series manner, using pulse modulation signals, to realize intelligent processing equivalent to the human brain, and more particularly to a pulse modulation operation circuit capable of performing parallel addition, scalar product calculation, etc. of pulse width modulation signals.

With the development of microelectronics, an apparatus has been realized, which can process a great amount of information, i.e. can perform intelligent processing or image signal processing. In such an apparatus, multi-bit numeric value information is processed using binary digital signals.

To represent the multi-bit numeric value information in an arithmetic circuit, pulses corresponding to the number of bits are necessary. Since, on the other hand, the energy consumed in a digital circuit is proportional to the number of pulses, high energy is required for one operation if multi-bit numeric value information is represented by a plurality of pulses. Further, since the signal processing is performed on a sequential basis, a large-scale circuit is required to process a plurality of signals in a parallel manner.

The intelligent processing in the human brain is basically very large-scale, parallel, sum-of-product calculation. To realize such intelligent processing by means of microelectronics, it is indispensable to perform calculations in a parallel manner and to save power. A digital arithmetic circuit which requires a great amount of power to process multi-bit numeric value information is, therefore, not suitable for such intelligent processing.

BRIEF SUMMARY OF THE INVENTION

The present invention has been developed under the above-described circumstances, and aims to provide an arithmetic operation circuit capable of parallel operation of a great number of input signals with a small number of elements at low energy consumption, thereby realizing intelligent processing equivalent to the processing of the human brain.

To attain the object, there is provided a pulse modulation operation circuit comprising: a current bus; a plurality of switch current sources connected parallel to each other and commonly connected to the current bus for generating current pulses corresponding to external input signals; means connected to the current bus for integrating the current pulses and converting them into a charge; and output means for converting the charge into a binary digital signal and outputting the binary digital signal.

The above structure enables parallel operation of a great number of input signals with a small number of elements at low energy consumption, and accordingly enable effective use of, for example, a low voltage CMOS device of deep-sub-micron further techniques, thereby realizing a high-performance, large-capacity and low-power-consumption intelligent information processing apparatus or image signal processing apparatus.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

First, the principle of arithmetic operations by the invention will be explained with reference to FIGS. 6A–6C.

Figure 6A:
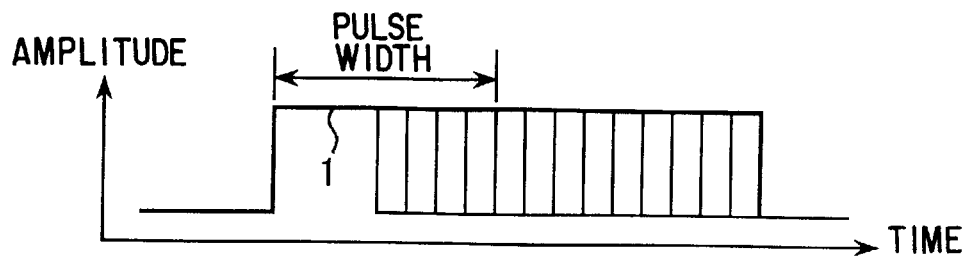
FIG. 6A is a view, showing the waveform of a pulse width modulation signal.

FIG. 6A shows the waveform of a PWM (Pulse Width Modulation) signal 1. The pulse width of the signal 1 represents a plurality of bit numbers which indicate analog information, although its amplitude is expressed by a digital value as in the case of a binary digital signal. Since each pulse of the signal 1 can express multi-bit information, arithmetic operation using the signal 1 requires only low energy.

Figure 6B:
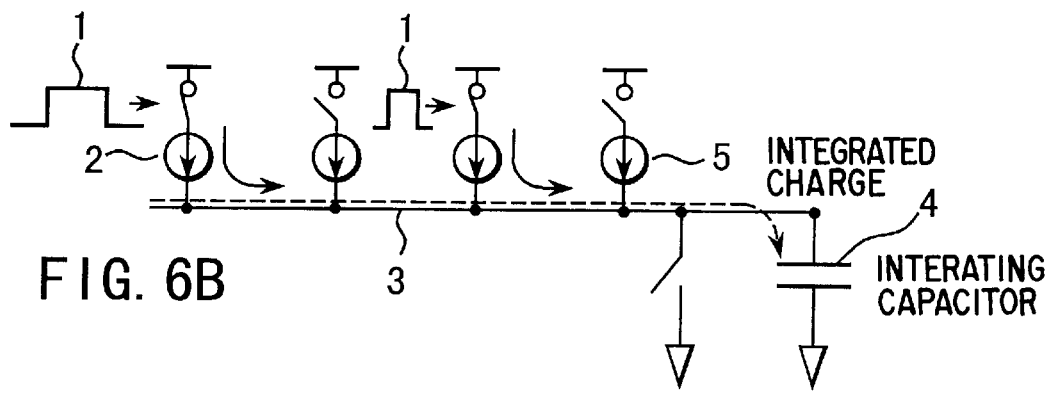
FIG. 6B is a view, useful in explaining the principle of arithmetic operations using the pulse width modulation signal.
Figure 6C:
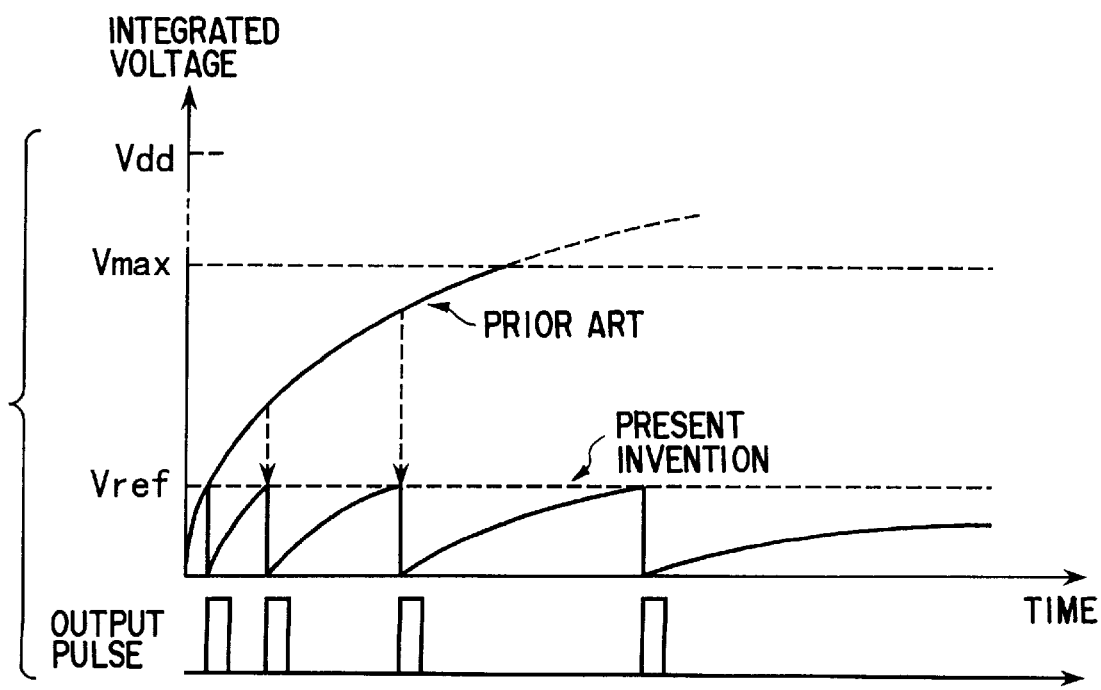
FIG. 6C is a graph, showing the relationship in the invention between changes in integrated voltage and an output pulse signal.

FIG. 6B shows the principle of arithmetic operation using the PWM signal. As is shown in FIG. 6B, when each switch current source 2 for generating a constant current when the PWM signal 1 is input is switched, each pulse of the signal 1 is converted into a current pulse with a width corresponding to the width of the pulse of the signal 1. Accordingly, parallel addition of PWM signals is realized simply by collecting, using a current bus 3, a plurality of current pulses generated from a plurality of switch current sources 2, and integrating the collected pulses using a single capacitor 4. In this operation, the PWM signals may be input out of synchronism with each other. On the other hand, a linearly operable integrated voltage range Vmax is determined from the output characteristics of a constant current source 5. If the threshold of a MOS transistor used as a current source is Vth, the range Vmax is substantially not more than (Vdd–Vth). Accordingly, in the parallel adder circuit shown in FIG. 6B, the operation scale including the number of pulses which can be simultaneously input, the total width of input pulses, etc. are limited by the power supply voltage.

In the invention, the integrated charge is discharged simultaneously when a certain charge which is determined from a reference voltage Vref and the capacitance of the integrating capacitor 4 is converted into a pulse. Repeating this operation enables a total integration charge to be converted into pulses. Accordingly, as is shown in FIG. 6C, the upper limit of the integrated voltage is restricted to the constant reference voltage Vref irrespective of the operation scale, which softens limits to the operation scale due to the power supply voltage, and enables very large-scale parallel input. Moreover, the operation results are obtained as the number of pulses, i.e. a digital value, and the conventional binary digital technique is applicable to a pulse counter circuit or to processing units located at later stages. A specific embodiment of the invention will now be described.

Figure 1:
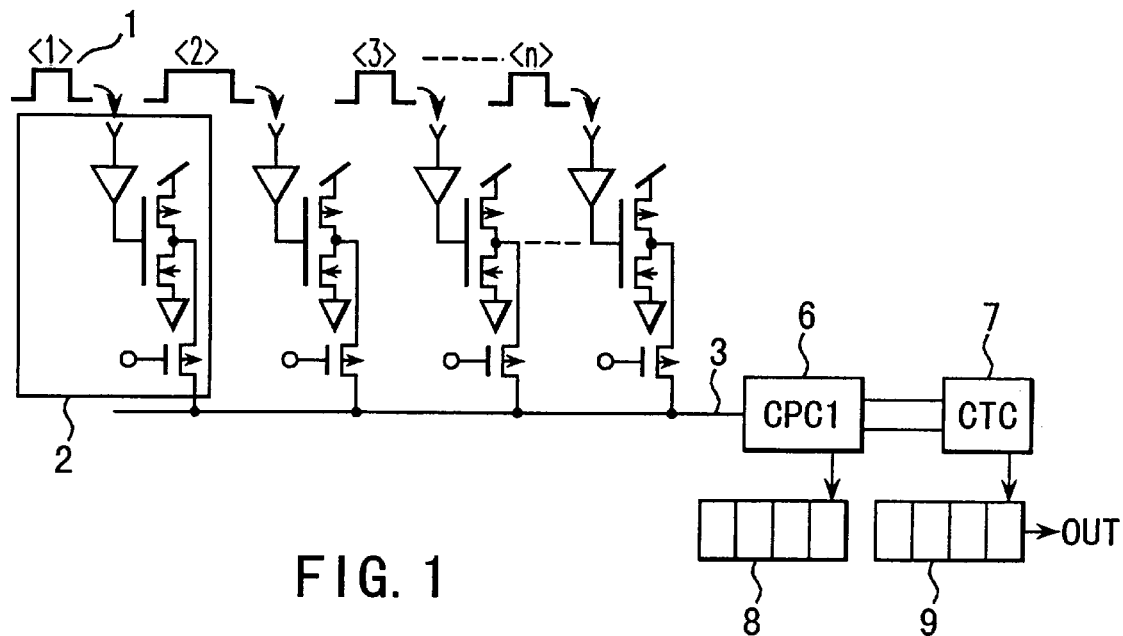
FIG. 1 is a circuit diagram, showing a pulse width modulation signal adder circuit according to a first embodiment of the invention.

Referring first to FIG. 1, a PWM signal adder circuit according to a first embodiment of the invention will be described. In this circuit, the pulse widths of a number n of PWM signals 1 are added simultaneously in a parallel manner and out of synchronism with each other, thereby outputting the addition result as a binary digital signal. The structure and operation of the circuit will be described in detail.

Each of <1>, <2>, <3>, . . . <n> PWM signals 1 is input to the switch current source 2, and a constant current is generated for a period corresponding to the pulse width of the signal. Thus, the signal 1 is converted into a current pulse. A number n of current pulses are added together on the common current bus 3, thereby obtaining, by capacitance integration, a total charge $Q_{total}$ which is proportional to the total pulse width of the n current pulses. A reference charge counter circuit ($CPC_1$) 6 therefore has a function for integration and a function for digitizing the total charge $Q_{total}$ in real time in units of a reference charge $Q_{std}$.

Furthermore, an extra charge $Q_r$ which occurs as a quantization error is digitized in a time-series manner by a charge-time converter circuit (CTC) 7 to improve the time resolution of arithmetic operation. The digitized values are digitally added in digital counter circuits 8 and 9, and output as a binary digital signal indicative of the PWM signal addition result.

Figure 2:
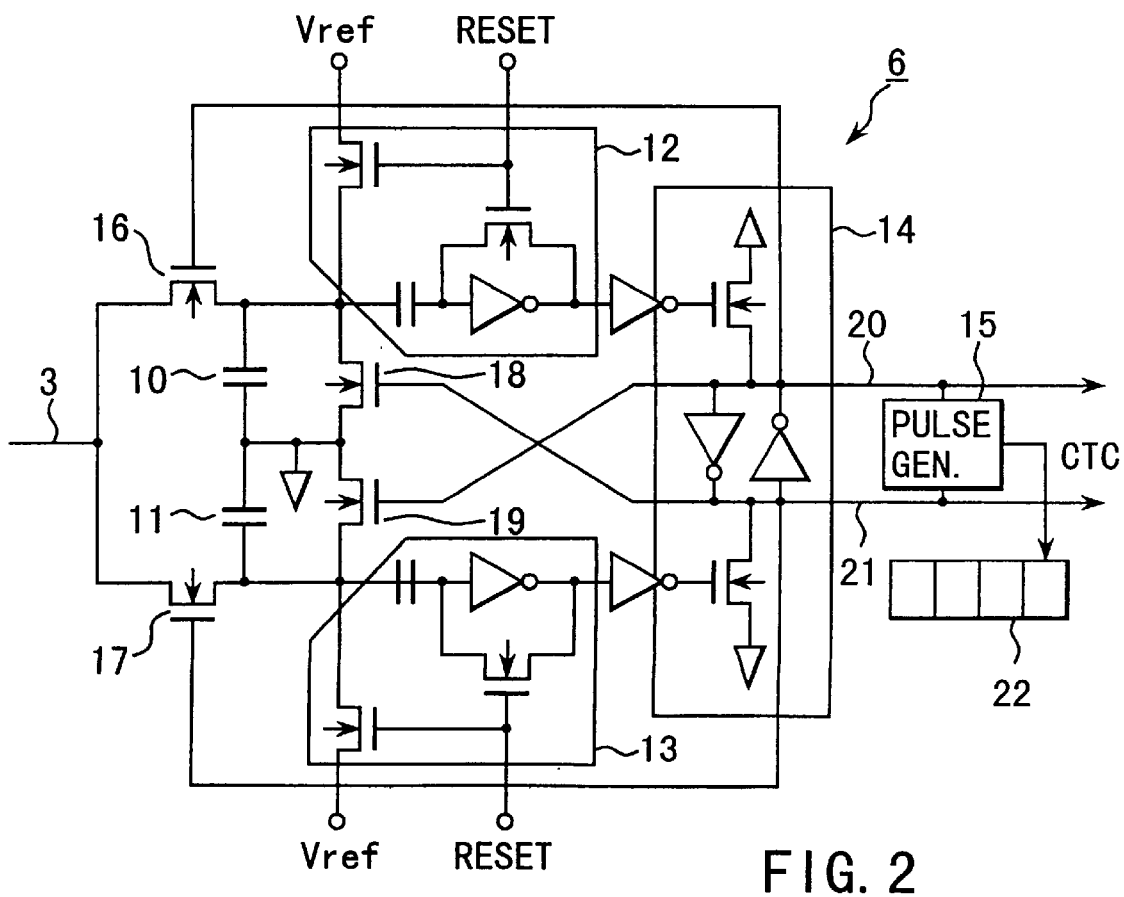
FIG. 2 is a circuit diagram, showing a reference charge counter circuit ($CPC_1$) included in the pulse width modulation signal adder circuit of FIG. 1.

As is shown in FIG. 2, the reference charge counter circuit 6 is provided for integrating current pulses, converting them into a charge and measuring that charge. Specifically, the circuit 6 comprises two integrating capacitors 10 and 11 connected in series, two chopper type voltage comparator circuits 12 and 13 for comparing the integrated voltages of the capacitors with an external reference voltage $V_{ref}$, a latch circuit 14 for controlling the integration and discharge operations of the integrating capacitors 10 and 11, and a pulse generating circuit 15 for generating a short pulse each time the state of the latch circuit varies. The integrating capacitors 10 and 11 have the same capacitance. The other end of the integrating capacitor 10 which is not connected to the capacitor 11 is connected to a switch 16 for connecting and disconnecting the capacitor to and from the common current bus 3, and also to a grounded switch 18 for discharge. Similarly, the other end of the integrating capacitor 11 is connected to a switch 17 for connecting or disconnecting the capacitor to and from the common current bus 3, and also to a grounded switch 19 for discharge. The junction between the capacitors 10 and 11 is grounded. The switches 16–19 are each connected to the output terminals 20 and 21 of the latch circuit 14 which are inverse in phase to each other, so that the integrating capacitors 10 and 11 will operate in opposite phases. Accordingly, while one of the capacitors integrates current pulses on the current bus, the other is controlled to perform discharge.

When the integrated voltage of the integrating capacitor, which is now connected to the common current bus 3 and executing integration, becomes equal to the external reference voltage $V_{ref}$, the outputs of the voltage comparator circuits 12 and 13 located at a later stage will be inverted, thereby changing the state of the latch circuit 14 and changing the capacitor connected to the common current bus 3 between the capacitors 10 and 11. Simultaneously, the pulse generating circuit 15 generates a short pulse, which is counted by a non-synchronous counter circuit 22 located after the circuit 15. The counter circuit 22 corresponds to the digital counter circuit 8 of FIG. 1.

Where the capacitance of the integrating capacitors 10 and 11 is $C_{int}$ and the external reference voltage is $V_{ref}$, the total charge $Q_{total}$ is digitized in units of $Q_{std}=C_{int}V_{ref}$. Supposing that the digitized value is N, $Q_{total}=NQ_{std}+Q_r$ is satisfied (where $Q_r$ ($<Q_{std}$) represents the quantization error).

Figure 3:
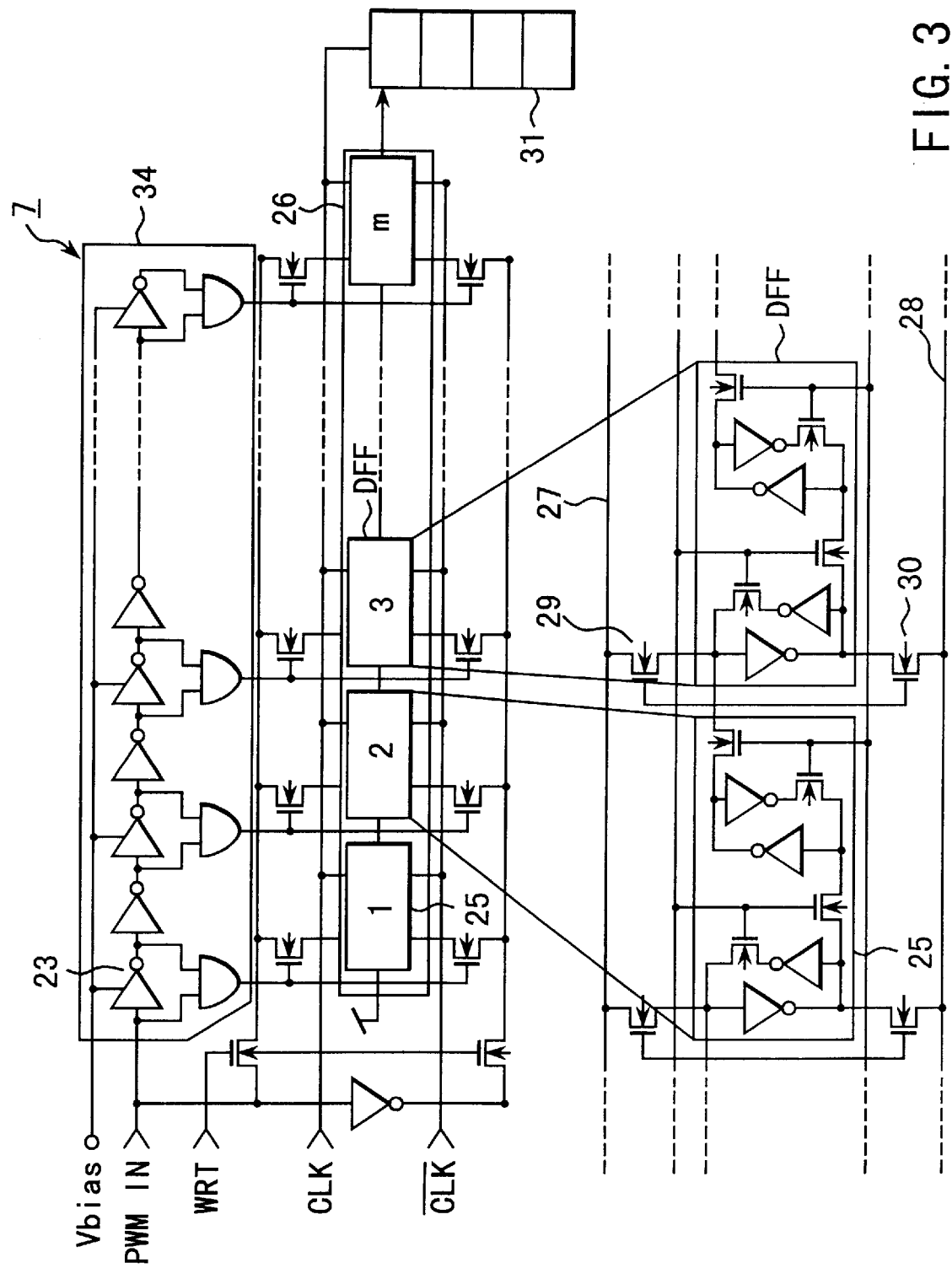
FIG. 3 is a circuit diagram, showing a charge-time converter circuit (CTC) included in the pulse width modulation signal adder circuit of FIG. 1.

As is shown in FIG. 3, the charge-time converter circuit 7 comprises a multi-phase clock generating circuit 24 consisting of a number m of delay circuits 23 connected in series, and a register circuit 26 consisting of a number m of DFF circuits 25 connected in series and corresponding to the delay circuits 23. Each delay circuit 23 generates a single pulse of a width not longer than its delay time when the aforementioned short output pulse rises. As a result, a number m of sequential pulses are generated from the multi-phase clock generating circuit 24. When each of the delay circuits 23 corresponding to the DFF circuits 25 generates a pulse, a gate transistor 29 or 30 for connecting one of the outputs of the latch circuit to a differential bit line 27 or 28 is turned on, thereby writing the state of the differential bit line into the register circuit 26. Thus, the state of the differential bit line is stored in the register circuit by the multi-phase clock generating circuit 24 in units of a delay time D, and stored contents are sequentially read in synchronism with external clocks.

The differential bit lines 27 and 28 of the charge-time converter circuit 7 of FIG. 3 are connected to the latch circuit 14 of the reference charge counter circuit 6 of FIG. 2. After the digitized value N of the total charge $Q_{total}$ is obtained, the switch current source to be referred to and the multi-phase clock generating circuit 24 are simultaneously turned on, thereby additionally integrating a reference current $I_{ref}$ and storing the state of the differential bit line in the register circuit. The time period for the additional integration performed until the state of the latch circuit 14 changes is stored as a succession of alternate "1"s and "0"s in the register circuit, and the state of the circuit 14 after the change is stored after the succession of numbers. A synchronous counter circuit 31 located after the register circuit 26 counts outputs from the charge-time converter circuit 7 in synchronism with the reading clock, thereby obtaining, from the output terminal of the register circuit, a number M of outputs stored in the DFF circuits 25 as "1" and "0". The counter circuit 31 corresponds to the digital counter circuit 9 of FIG. 1.

Where the reference current satisfies $Q_{std}=mDI_{ref}$, M represents a value obtained by digitizing the extra charge $Q_r$ in units of $DI_{ref}$. In this case, $Q_r=MDI_{ref}+Q'_r$ is established, and $Q'_r$ ($<DI_{ref}$) represents a quantization error after the digitization of the extra charge $Q_r$.

From the digitized value N obtained from the reference charge counter circuit 6 and the digitized value M obtained from the charge-time converter circuit 7, it is determined that the addition result is $2^k N+M$ where $m=2^k$. The binary digital representation can be realized by connecting the non-synchronous counter circuit 22 to the synchronous counter circuit 31, with lower significant bits of the circuit 22 set as k bits.

As described above, in the PWM signal adder circuit of the first embodiment, a plurality of switch current sources 2 are connected parallel to each other and then to the common current bus 3, and the two integrating capacitors 10 and 11 alternately integrate current pulses. The capacitors 10 and 11 are controlled by the latch circuit 14 such that one of them integrates current pulses while the other performs discharge, and such that the operations of the capacitors are changed to each other when an integrated voltage corresponding to the integrated current pulses has reached the reference voltage $V_{ref}$. The number of occasions on which the state of the latch circuit 14 changes is counted by the non-synchronous counter circuit 22 to obtain a digitized value of the total integrated charge. Moreover, the integrated charges which remain in the integrating capacitors 10 and 11 and are considered as a quantization error are converted, by additional integration of the reference current $I_{ref}$, into a time period required from the start of integration to the time when the voltage has reached the reference voltage. As a result, the operation resolution can be increased by ten times. The circuit of the first embodiment is not limited to the addition of the PWM signals, but also applicable to the addition of usual pulse signals to output the addition result as a binary digital signal.

Figure 4:
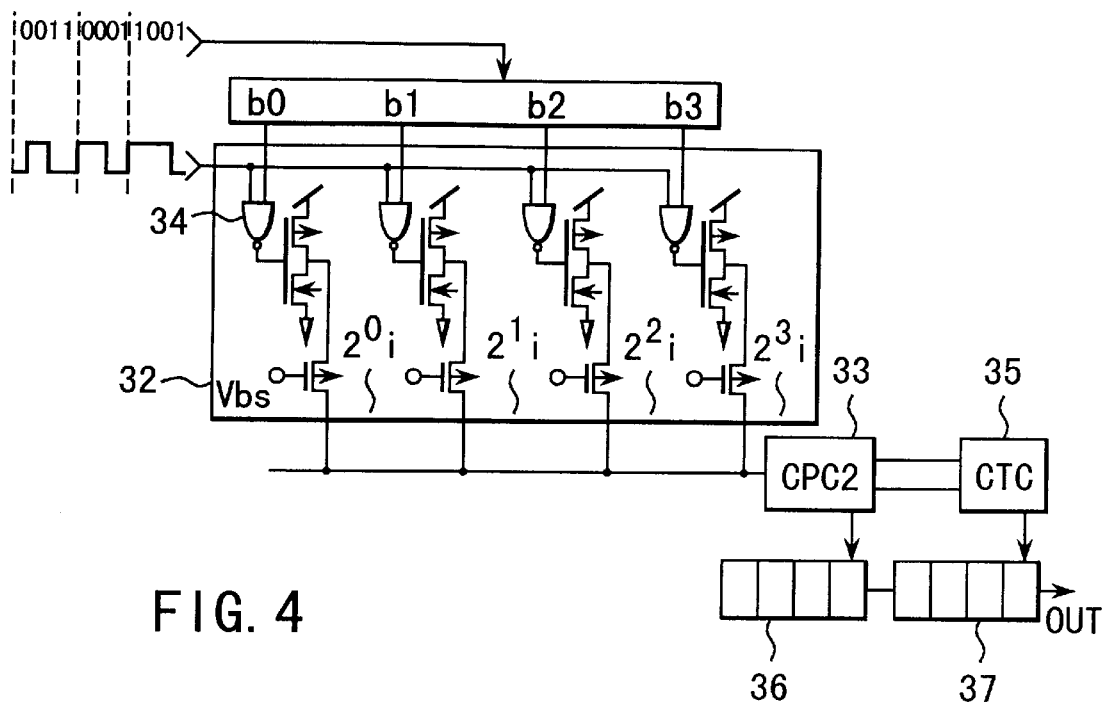
FIG. 4 is a circuit diagram, showing a pulse width modulation signal sum-of-product calculating circuit according to a second embodiment of the invention.

A second embodiment of the invention will now be described. FIG. 4 shows a PWM signal sum-of-product calculating circuit according to the second embodiment. In this embodiment, the sum-of-product calculation is performed by multiplying each pulse of a PWM signal pulse train by a corresponding pulse of a binary digital signal pulse train indicative of a 4-bit integer train. Supposing that each signal is a vector component, the scalar product of the PWM signal vector and the integer vector is obtained. The structure and operation of the circuit of the second embodiment are similar to those of the PWM signal adder circuit of the first embodiment (FIG. 1), except that the former circuit incorporates a 4-bit weighted switch current source 32 and a reference charge counter circuit 33 with a single integrating capacitor. The manner of sum-of-product calculation and the reference charge counter circuit 33 will be described in detail.

In the second embodiment, the PWM signal and the 4-bit binary signal as a multiplier are input to the 4-parallel switch current source 32 in which the reference current $I_{ref}$ is weighted with $2^i$ (i=0, 1, 2, 3). An AND circuit 34 is used for switching the switch current source, to permit the switch current source to convert each pulse of the PWM signal into a current pulse, only when the switch current source receives a 4-bit binary signal pulse indicative of a bit value of "1". The weight of each bit is equal to that of a corresponding current pulse. The current pulses are integrated by the reference charge counter circuit 33 to obtain an integration result. The quantization error of the reference charge counter circuit 33 is measured by a charge-time converter circuit 35 located after the circuit 33, which is similar to the charge-time converter circuit 7 employed in the first embodiment. Each pair of components of both signal trains are sequentially multiplied, and multiplication results are added in counter circuits 36 and 37, thereby obtaining a sum-of-product calculation result in the form of a binary digital signal. Thus, the scalar product of a PWM signal vector and an integer vector expressed in the form of a binary digital signal can easily be obtained using the PWM signal sum-of-product calculating circuit of the second embodiment.

It is a matter of course that the 4-parallel switch current source 32 weighed as above can be used in place of the switch current source 2 employed in the PWM signal adder circuit with the two integrating capacitors according to the first embodiment.

Figure 5:
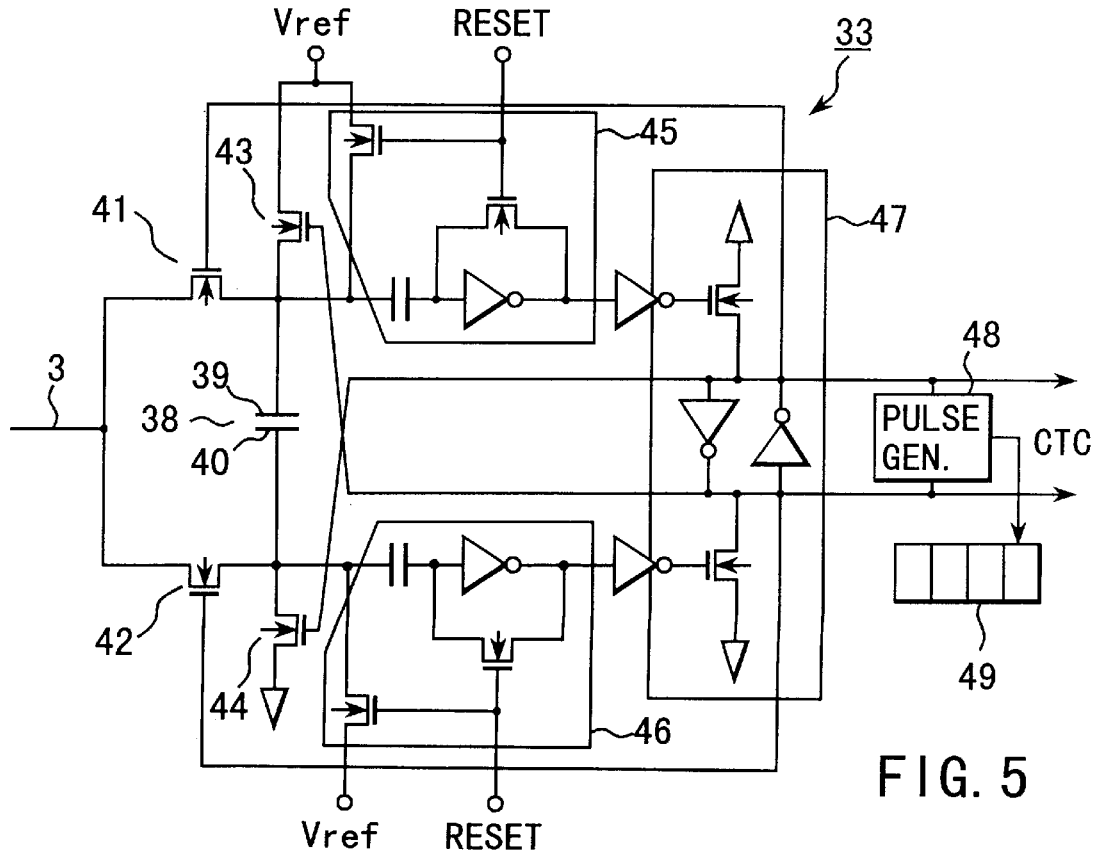
FIG. 5 is a circuit diagram, showing a one integration capacitance type reference charge counter circuit ($CPC_2$) included in the circuit of FIG. 4.

FIG. 5 shows the reference charge counter circuit 33 with the single integrating capacitor used in the second embodiment. The circuit 33 differs from the reference charge counter circuit 6 used in the first embodiment in that in the former, current pulses are integrated alternately through an upper electrode 39 and a lower electrode 40 which constitute a single integrating capacitor 38, whereas in the latter, current pulses are integrated alternately by the two integrating capacitors 10 and 11. The upper and lower electrodes 39 and 40 of the integrating capacitor 38 are respectively connected to switches 41 and 42 which are connected to the common current bus 3. Moreover, the upper electrode 39 is connected to a switch 43 connected to an external reference voltage $V_{ref}$, and the lower electrode 40 to a switch 44 grounded for discharge. Chopper type voltage comparator circuits 45 and 46 are connected to the upper and lower electrodes 39 and 40, respectively, and also to the external reference voltage $V_{ref}$, to compare the integrated voltage of the integrating capacitor 30 with the external reference voltage $V_{ref}$. Depending upon whether a latch circuit 47 controlled by the outputs of the voltage comparator circuits 45 and 46 assumes a first state or a second state, it is determined whether current pulses from the common current bus 3 are integrated through the upper electrode 39 (with the lower electrode 40 grounded) or through the lower electrode 40 (with the upper electrode 40 kept at the reference voltage $V_{ref}$). These operations are alternately repeated. The integrated current is digitized in units of the product ($V_{ref} \times C_{38}$) of the reference charge $V_{ref}$ (based on the external reference voltage $V_{ref}$) and the capacitance $C_{38}$ of the integrating capacitor 38.

As described above, the reference charge counter circuit 33 of the second embodiment is controlled by the latch circuit 47, such that current is integrated alternately through the upper and lower electrodes 39 and 40 of the integrating capacitor 38, and that the electrodes are switched from one to the other when an integrated voltage corresponding to the integrated current has reached a reference voltage. Where the upper electrode 39 is kept at the reference voltage, no current is discharged since the integrated voltage is increased up to the reference voltage immediately before the electrode 39 is kept at the reference voltage. Thereafter, if input current is integrated through the lower electrode 40, the arithmetic operation advances to eliminate the potential difference between the electrodes, i.e. to discharge the current. At the time of again integrating current through the upper electrode, the lower electrode 40 is grounded with the potential difference between the electrodes 39 and 40 kept zero, and therefore only a little current is discharged due to a parasitic capacitance which is sufficiently smaller than the capacitance of the capacitor 38. In other words, the discharge does not require much time, which enables the single capacitor to perform continuous integration of current. A pulse is generated from a pulse generating circuit 48 when the state of the latch circuit 47 changes. The number of occasions in which such a pulse is generated is counted by a non-synchronous counter 49 located after the circuit 48, to obtain a digitized value of a totally integrated charge. The circuit of the second embodiment is also applicable to a device for adding general signal pulses and outputting the addition result as a binary digital signal, as well as a device for the addition of PWM signal pulses.

The invention is not limited to the above-described embodiments, but may be modified in various manners without departing from its technical scope.

The parallel operation circuit of the invention has advantages stated below, as compared with the conventional multi-bit binary digital signal parallel operation circuit.

The switching current integration using a PWM signal enables reduction of elements used in parallel sum-of-product calculation by a hundred times or more, and also reduction of power consumed for each calculation by ten to a hundred times. A parallel operation circuit with sixty four or more inputs can be realized since the upper limit of the integrated voltage is restricted to a constant value by discharging a constant charge. Furthermore, since the upper limit of the integrated voltage can be set at a low value, the required voltage can be reduced and hence power consumption be greatly reduced. Accordingly, a low voltage CMOS device of deep-sub-micron further techniques will be able to be effectively used, thereby realizing a high-performance, large-capacity and low-power-consumption intelligent information processing apparatus or image signal processing apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A pulse modulation operation circuit comprising:
   a current bus;
   a plurality of switch current sources connected parallel to each other and commonly connected to the current bus for generating current pulses corresponding to external input signals;
   means connected to the current bus for integrating the current pulses and converting them into a charge; and
   output means for converting the charge into a binary digital signal and outputting the binary digital signal.

2. A circuit according to claim 1, wherein the external input signals is a pulse width modulation signal.

3. A circuit according to claim 1, wherein:
   the charge conversion means includes two capacitors connected in series; and
   the output means includes means for controlling the two capacitors such that one of the capacitors integrates current pulses and converts them into a charge while the other capacitor discharges a charge accumulated therein, and that when the integrated voltage of the one capacitor has reached a reference voltage, the other capacitor performs such integration and conversion and the one capacitor performs such discharge.

4. A circuit according to claim 3, wherein the external input signal is a pulse width modulation signal.

5. A circuit according to claim 3, wherein the plurality of switch current sources includes a switch current source controlled by means for generating an AND signal of at least two external input signals, thereby generating the current pulses.

6. A circuit according to claim 5, wherein one of the external input signals consists of a pulse width modulation signal with a pulse train, the other external input signal is binary and digital and is represented as a pulse train indicative of bit integers, and sum-of-product calculation is performed wherein corresponding pulses of both the pulse width modulation signal and the binary digital signal are sequentially multiplied together and the multiplication results are added.

7. A circuit according to claim 1, wherein:
   the charge conversion means includes a single capacitor having first and second electrodes, the first and second electrodes being connected to the current bus via first and second switches, respectively, the first electrode being connected to an external reference potential via a third switch, the second electrode being grounded via a fourth switch; and
   the output means includes means for controlling the first through fourth switches, when the integrated voltage of one of the first and second electrodes has reached a reference voltage, to switch the state of the capacitor between a state in which the first electrode is connected to the current bus and the second electrode is grounded, and a state in which the second electrode is connected to the current bus and the first electrode is connected to the external reference potential; charge counter means for counting the number of switch operations of the switches; and charge-time converter means connected to the charge counter means for measuring an extra charge in the capacitor when the charge counter means perform counting.

8. A circuit according to claim 7, wherein the external input signal is a pulse width modulation signal.

9. A circuit according to claim 7, wherein the plurality of switch current sources includes a switch current source controlled by means for generating an AND signal of at least two external input signals, thereby generating the current pulses.

10. A circuit according to claim 9, wherein one of the external input signals consists of a pulse width modulation signal with a pulse train, the other external input signal is binary and digital and is represented as a pulse train indicative of bit integers, and sum-of-product calculation is performed wherein corresponding pulses of both the pulse width modulation signal and the binary digital signal are sequentially multiplied together and the multiplication results are added.

11. A circuit according to claim 1, wherein the plurality of switch current sources includes a switch current source controlled by means for generating an AND signal of at least two external input signals, thereby generating the current pulses.

12. A circuit according to claim 11, wherein one of the external input signals consists of a pulse width modulation signal with a pulse train, the other external input signal is binary and digital and is represented as a pulse train indicative of bit integers, and sum-of-product calculation is performed wherein corresponding pulses of both the pulse width modulation signal and the binary digital signal are sequentially multiplied together and the multiplication results are added.

* * * * *